US007683352B2

United States Patent
Inanami

(10) Patent No.: US 7,683,352 B2
(45) Date of Patent: Mar. 23, 2010

(54) ELECTRON BEAM WRITING DATA CREATING METHOD AND ELECTRON BEAM WRITING DATA CREATING APPARATUS

(75) Inventor: Ryoichi Inanami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 11/783,037

(22) Filed: Apr. 5, 2007

(65) Prior Publication Data
US 2007/0281490 A1    Dec. 6, 2007

(30) Foreign Application Priority Data
Apr. 6, 2006  (JP)  ............... 2006-105476

(51) Int. Cl.
G21G 1/00    (2006.01)
G21K 5/00    (2006.01)

(52) U.S. Cl. ............... 250/492.22; 250/492.1; 250/492.2; 250/492.3; 716/5; 716/18; 716/21

(58) Field of Classification Search ........... 250/492.22, 250/492.23, 492.3, 492.1, 492.2, 492.21; 716/1, 2, 3, 4, 5, 8, 9, 11, 21; 430/296, 297, 430/298
See application file for complete search history.

(56) References Cited

U.S. PATENT DOCUMENTS 6,313,476 B1 *   11/2001  Shimizu et al.  ........ 250/492.22
6,543,044 B2      4/2003   Inanami et al.
6,924,071 B1 *    8/2005   Buck ........................... 430/30
2001/0028991 A1  10/2001   Inanami et al.
2002/0036273 A1 * 3/2002   Okino ..................... 250/491.1
2003/0128813 A1 * 7/2003   Appleby et al. ............. 378/147
2005/0118516 A1 * 6/2005   Okumura et al. ............... 430/5
2005/0208772 A1 * 9/2005   Inanami ..................... 438/712

FOREIGN PATENT DOCUMENTS

JP      05-206275      8/1993
JP      2000-348084    12/2000
JP      2005-268657    9/2005

* cited by examiner

Primary Examiner—Jack I Berman
Assistant Examiner—Nicole Ippolito Rausch
(74) Attorney, Agent, or Firm—Finnegan, Henderson, Farabow, Garrett & Dunner, L.L.P.

(57) ABSTRACT

An electron beam writing data creating method for creating writing data used for electron beam lithography includes judging whether a resizing process needs to be performed to a figure cell in device pattern data by cell based design or not, the figure cell including a cell layout frame and a pattern in the cell layout frame; performing the resizing process to the figure cell based on a relationship between the cell layout frame and the pattern, and resizing quantity of the resize process in a case where the resizing process is judged as needed to be performed; creating a character pattern cutting frame from the cell layout frame; and extracting a figure in the character pattern cutting frame as a character pattern.

11 Claims, 8 Drawing Sheets

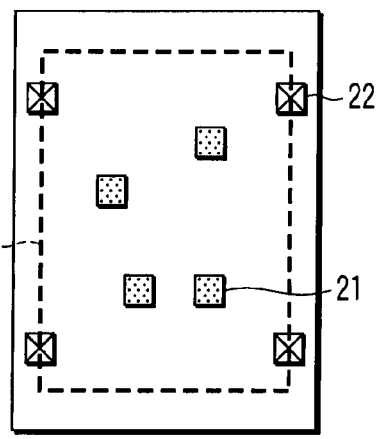
FIG. 1
(PRIOR ART)
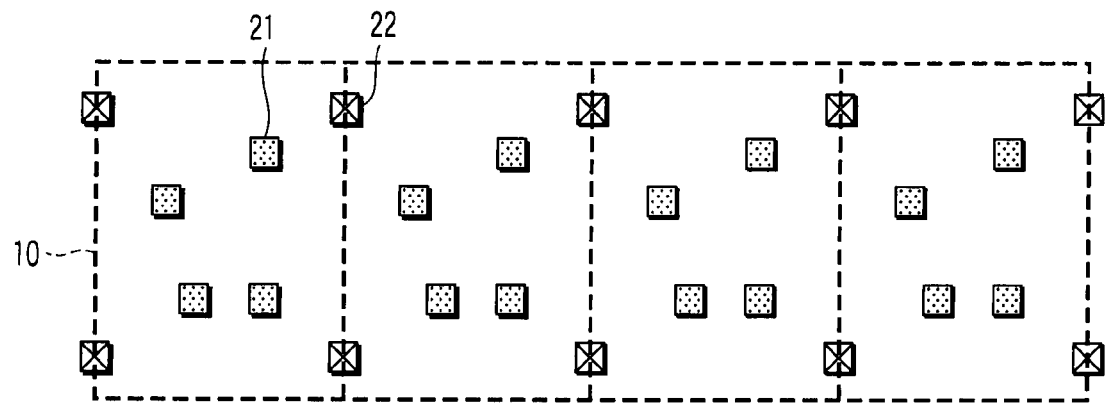
FIG. 2
(PRIOR ART)
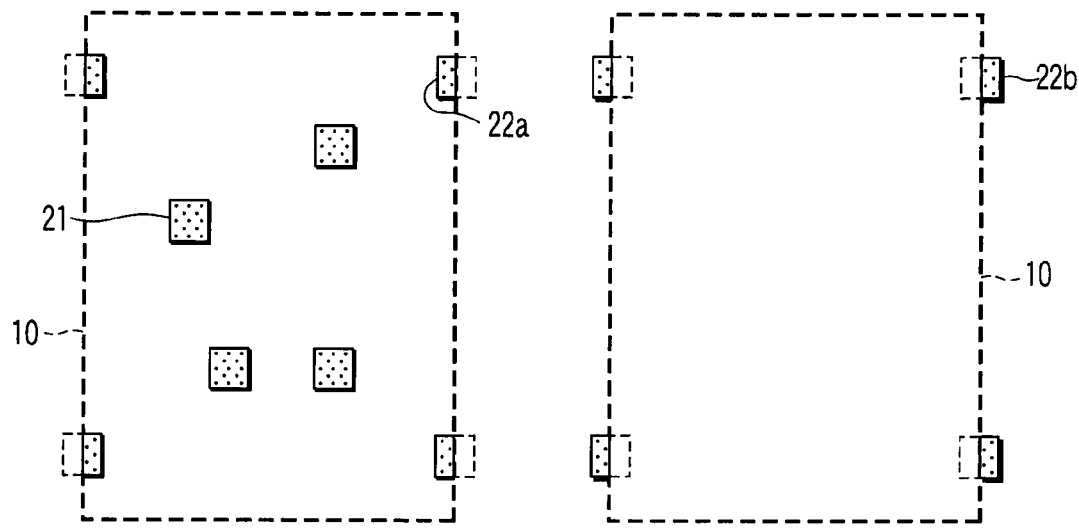
FIG. 3A
(PRIOR ART)
FIG. 3B
(PRIOR ART)

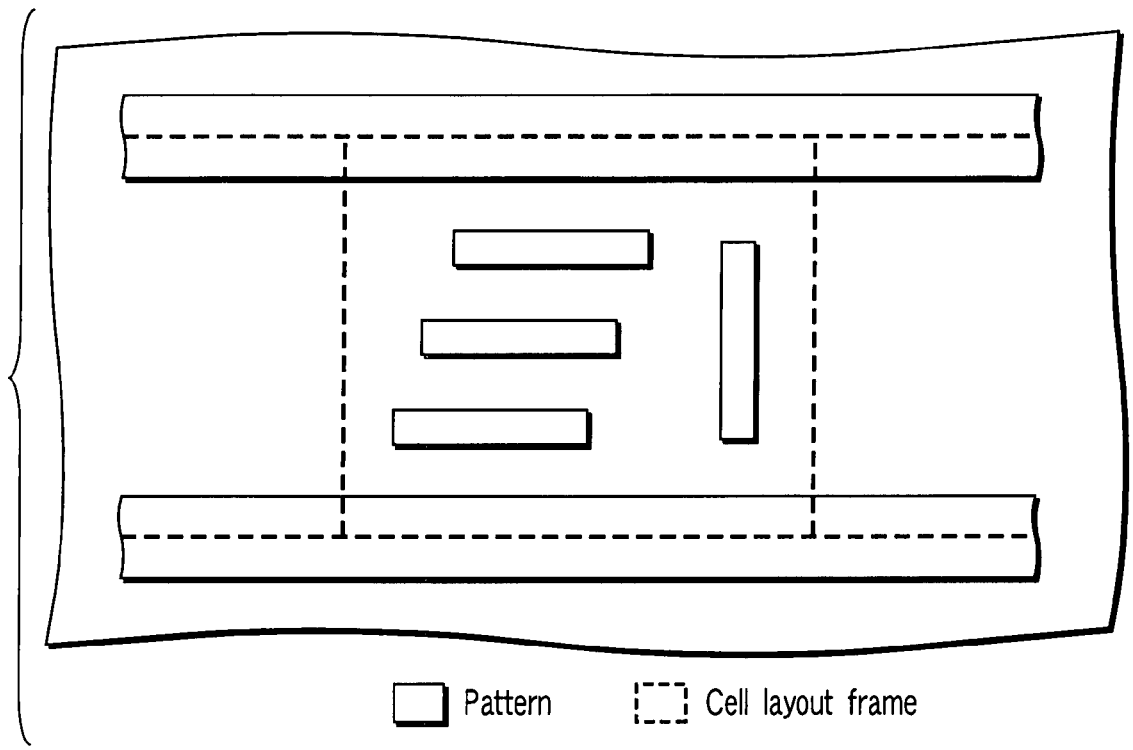
F I G. 4
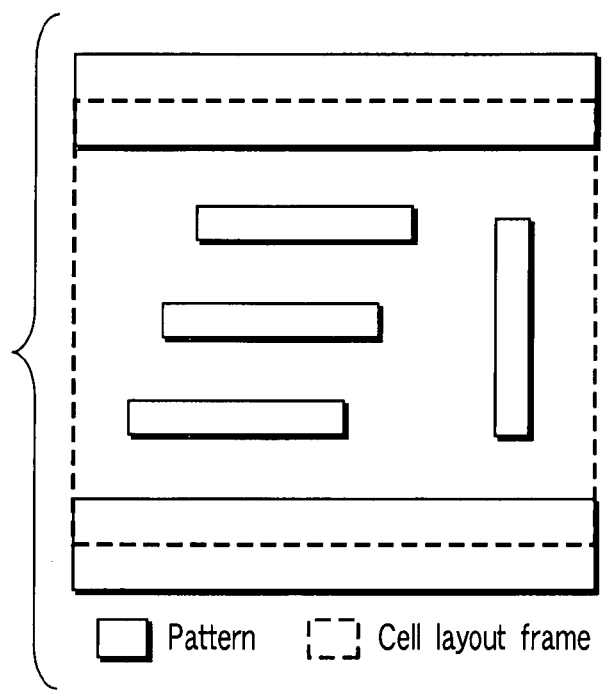
F I G. 5

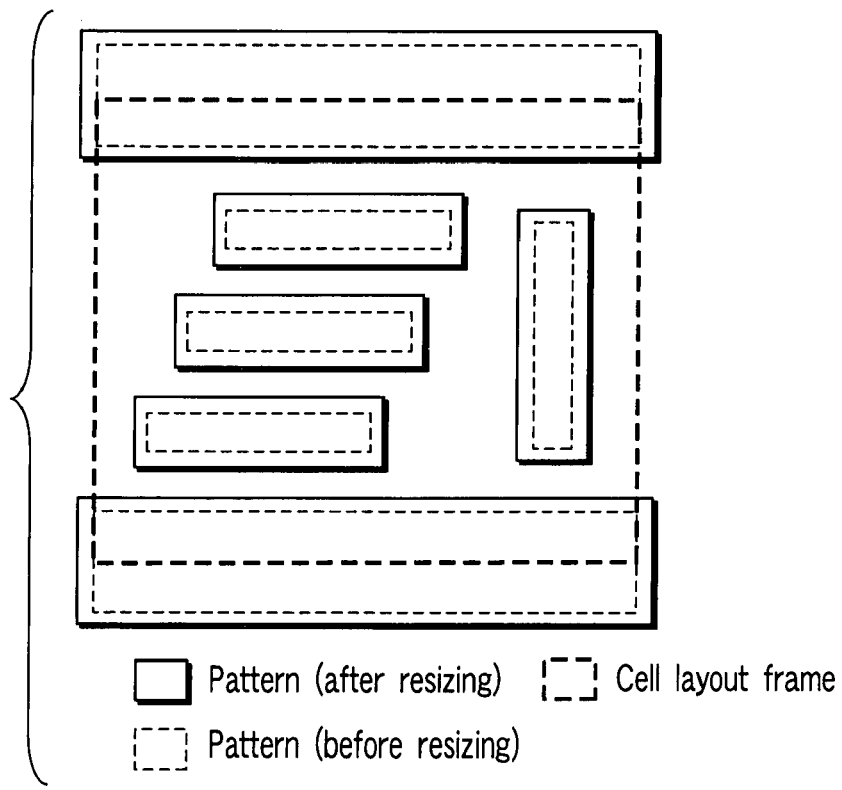
☐ Pattern (after resizing)   ⬚ Cell layout frame
⬚ Pattern (before resizing)
F I G. 6
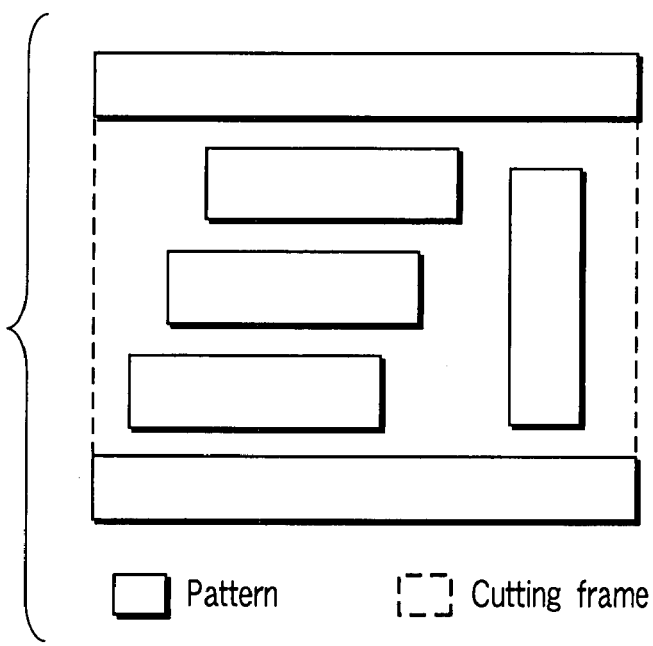
☐ Pattern   ⬚ Cutting frame
F I G. 7

☐ Pattern (after resizing)  ⌐⌐⌐ Cell layout frame
⌐⌐⌐ Pattern (before resizing)

☐ Pattern  ⌐⌐⌐ Cutting frame

ELECTRON BEAM WRITING DATA CREATING METHOD AND ELECTRON BEAM WRITING DATA CREATING APPARATUS

CROSS-REFERENCE TO RELATED APPLICATIONS

This application is based upon and claims the benefit of priority from prior Japanese Patent Application No. 2006-105476, filed Apr. 6, 2006, the entire contents of which are incorporated herein by reference.

BACKGROUND OF THE INVENTION

1. Field of the Invention

This invention relates to an electron beam writing data creating method and an electron beam writing data creating apparatus for creating writing data used in electron beam lithography.

2. Description of the Related Art

In the manufacture of semiconductor devices, electron beam (EB) lithography is used to expose fine patterns incapable of being exposed in photolithography. In EB lithography, EB direct writing techniques require no mask preparation for each pattern to be exposed and have thus drawn attention as a QTAT, low-cost fine pattern exposure method. Further, the character projection (CP) method using an opening of a shape of a pattern repeatedly shot enables the number of EB shots to be reduced, thus the writing throughput is improved as compared with the conventional variable shaped beam (VSB) method. Therefore, an apparatus capable of writing by not only the VSB method but also the CP method has been developed further.

In EB direct writing by the CP method, the key factor is to extract repetitive patterns (character patterns) from the pattern data for writing.

Methods of extracting character patterns include a method of creating data obtained by removing overlaps from the pattern data for writing and extracting patterns of the same shape equal to or smaller than the maximum size of the beam (normally several μm □) and a method of extracting figure cells in device pattern data by cell based design (Jpn. Pat. Appln. KOKAI Publication No. 2000-348084).

The process of extracting a character pattern is often performed at the time of data conversion. Generally, it is performed when the GDSII stream format, which is commonly used as a semiconductor device layout data format, is converted into a writing data format unique to each EB writing apparatus.

In this process, to turn figure cells into a character pattern, it is necessary to edit and modify the figure cell data before the data conversion process in order to prevent double exposure.

For example, to turn a standard cell, which is used for designing a logic device, into a character pattern, such a pattern as shown in FIG. 1 is arranged repeatedly, as shown in FIG. 2, in which the cells are arranged based on a cell layout frame. In FIGS. 1 and 2, numeral 10 indicates a cell layout frame, 21 a contact hole with no overlap, and 22 a contact hole with an overlap.

As shown in FIG. 1, when there is a pattern overlapping with the cell layout frame 10, if the entire cell is used as a character pattern, it overlaps with the adjacent patterns as shown in FIG. 2. If these overlapping patterns are used as character shots and writing is done by the CP method, as the overlapping patterns are exposed twice, the accuracy of the dimensions of the patterns is degraded.

A method of extracting a character pattern automatically from the pattern data of the figure cells which can solve double exposure problem and reduce the burden of character modifying work on the user has been proposed. In this method, a character pattern cutting frame is created from a cell layout frame included in figure cells, the figures in the character pattern cutting frame are used as the character pattern, and the character pattern is allocated to the pattern to be shot by the CP method (Jpn. Pat. Appln. KOKAI Publication No. 2005-268657).

For example, when the standard cells in FIG. 1 are used as characters, the figure cells to be used as the character patterns are separated into those inside the cell layout frame 10 and those outside the cell layout frame 10 as shown in FIGS. 3A and 3B, thereby separating the figure cells into patterns overlapping with other patterns and patterns not overlapping with other patterns. This makes it possible to create data of a character pattern which can be shot by CP method so as not to overlap with adjacent patterns.

In FIGS. 3A and 3B, 22a and 22b refer to a pattern located inside the cell layout frame 10 and a pattern located outside the cell layout frame 10, respectively, in the contact holes 22 with an overlap shown in FIG. 2. FIG. 3A shows a character pattern. FIG. 3B shows a non-character pattern.

However, as disclosed in Jpn. Pat. Appln. KOKAI Publication No. 2000-348084, when the extracted character pattern is resized, the accuracy of the connection between the character patterns and the dimensional accuracy of connecting portion of the patterns may deteriorate.

Further, Jpn. Pat. Appln. KOKAI Publication No. 2000-348084 discloses a method for solving the problem of the accuracy of connection between the character patterns, in which the figure cells to be extracted are expanded in the upper layer, and then the character pattern are extracted.

However, in this method, since the figure cells to be extracted are expanded into the upper layer cell, the figure calculation amount at the time of extracting character patterns increases. Further, since the figure cells to be extracted are expanded into the upper layer cells, the figure cells to be extracted cannot be treated as figure cells. Therefore, the cell layout frame cannot be used as a character pattern cutting frame, which makes it impossible to extract the original figure cells.

BRIEF SUMMARY OF THE INVENTION

According to an aspect of the present invention, there is provided an electron beam writing data creating method for creating writing data used for an electron beam lithography process comprising: judging whether a resizing process needs to be performed to a figure cell in a device pattern data by cell based base design or not, the figure cell including a cell layout frame and a pattern in the cell layout frame; performing the resizing process to the figure cell based on a relationship between the cell layout frame and the pattern, and resizing quantity of the resize process in a case where the resizing process is judged as needed to be performed to the figure cell; creating a character pattern cutting frame from the cell layout frame; and extracting a figure in the character pattern cutting frame as a character pattern.

According to an aspect of the present invention, there is provided an electron beam writing data creating apparatus for creating writing data used in electron beam lithography comprising: a judgment unit configured to judge whether a figure cell including a cell layout frame and a pattern in device pattern data produced by cell based design, needs to be subjected to a resizing process in character projection-based electron beam lithography; a resizing process unit configured to perform the resizing process the figure cell based on a relationship between the cell layout frame and the pattern and resizing quantity of the resize process in a case where the resizing process is judged as needed to be performed to the figure cell; a frame creating unit configured to create a character pattern cutting frame from the cell layout frame; and an extracting unit configured to extract a figure in the character pattern cutting frame as a character pattern.

BRIEF DESCRIPTION OF THE SEVERAL VIEWS OF THE DRAWING

FIG. 1 shows an example of a standard cell;

FIG. 2 shows an example of arranging standard cell in a chip;

FIGS. 3A and 3B show an example of cell layout frame character pattern extraction;

FIG. 4 shows an example of the layout of figure cells of a candidate character pattern in a device pattern;

FIG. 5 shows figure cells of a candidate character pattern;

FIG. 6 shows figure cells obtained by resizing the figure cells of FIG. 4 so as to expand the pattern uniformly;

FIG. 7 shows the character pattern extracted from the figure cells of FIG. 4 subjected to the resizing (expanding) process;

DETAILED DESCRIPTION OF THE INVENTION

Hereinafter, referring to the accompanying drawings, embodiments of the invention will be explained.

First, an explanation is given of the character pattern extracting method disclosed in Jpn. Pat. Appln. KOKAI Publication No. 2005-268657, which is problematic when a resizing process is used with the electron beam writing data creating method disclosed in Jpn. Pat. Appln. KOKAI Publication No. 2000-348084. The problem will be explained in detail.

FIG. 4 shows a layout example of figure cells of a candidate character pattern in a device pattern produced by cell based design. FIG. 5 shows figure cells of a candidate character pattern of FIG. 4. FIG. 6 shows figure cells obtained by resizing the figure cells of FIG. 4 so as to expand the figure uniformly. As shown in FIG. 6, a part of the figure cells resized to expand the pattern uniformly protrudes into the area of an adjacent cell. However, as shown in FIG. 7, only the patterns in the character pattern cutting frame created from the cell layout frame are extracted as character patterns, regardless of the presence or absence of any protruding patterns. Therefore, the area of the adjacent cell is unaffected.

Figure 8:
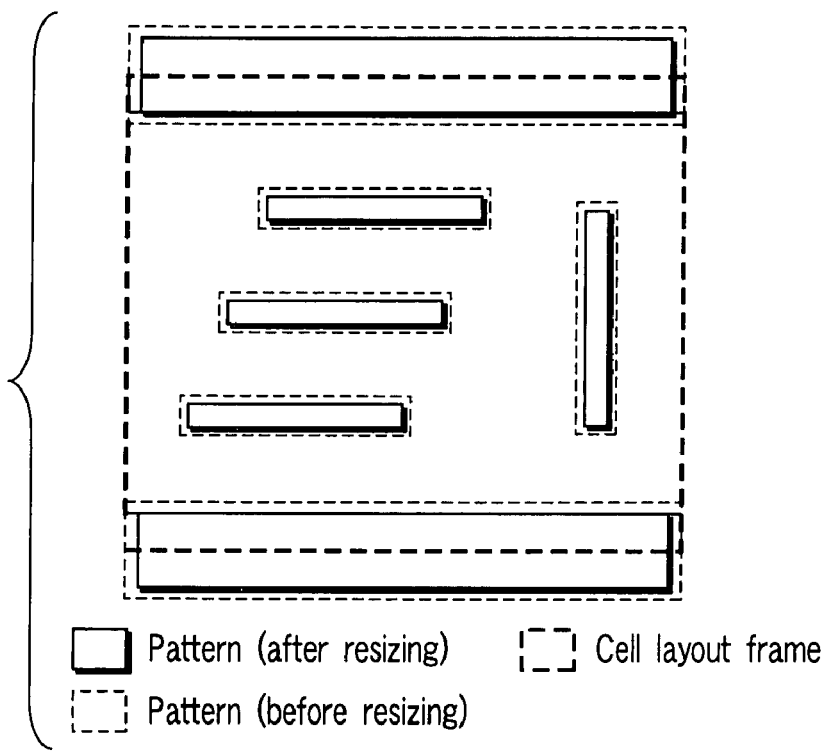
FIG. 8 shows figure cells obtained by resizing the figure cells of FIG. 4 so as to shrink the pattern uniformly.
Figure 9:
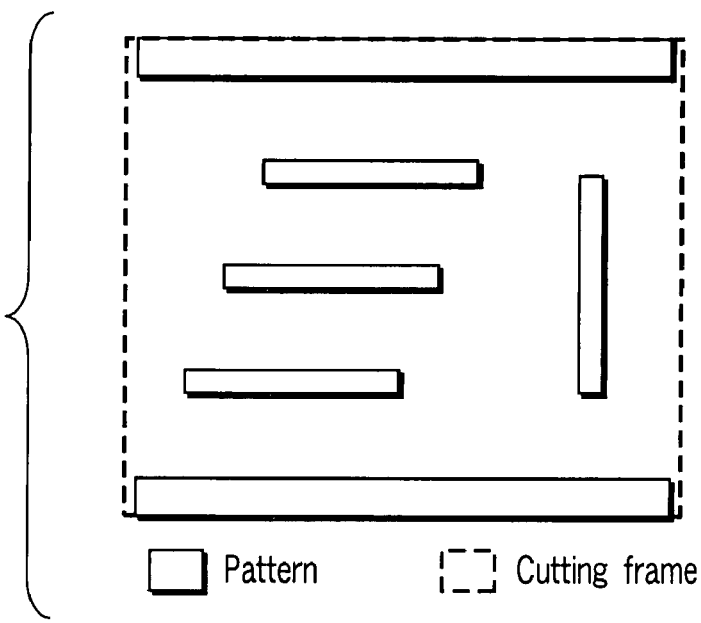
FIG. 9 shows the character pattern extracted from the figure cells of FIG. 4 subjected to the resizing (shrinking) process.
Figure 10:
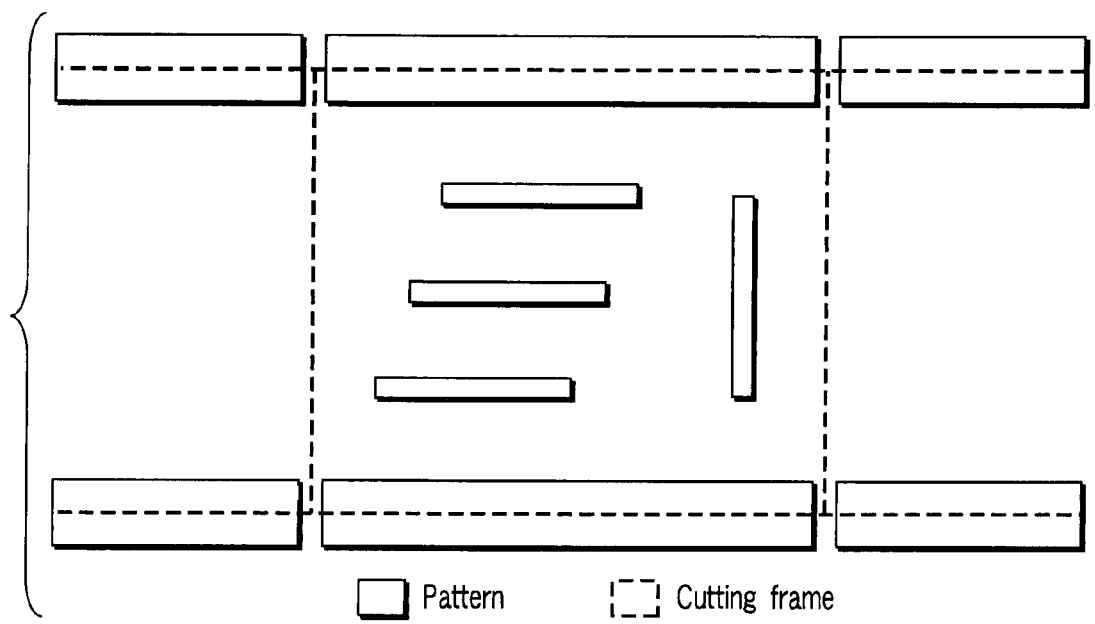
FIG. 10 shows patterns drawn using the extracted character pattern in FIG. 9.

On the other hand, FIG. 8 shows figure cells obtained by resizing the figure cells of FIG. 4 so as to shrink the pattern uniformly. In this case, as shown in FIG. 9, the patterns in the character pattern cutting frame created from the cell layout frame are extracted as the character pattern. If the extracted character pattern is allocated to a pattern to be shot by CP method and writing is done, the patterns which originally should be connected between cells are not connected properly, as shown in FIG. 10. Consequently, the manufactured semiconductor device does not function as an electronic circuit. In addition, as a pattern of a connecting portion between cells cannot be connected solely by use of character patterns, it is necessary to supplement a writing pattern by shooting the pattern of the connecting portion between cells via the VSB method.

First Embodiment

As described above, when the character pattern is extracted by carrying out a shrinking process in the resizing process, if all of the patterns constituting the figure cells in the device pattern data produced by cell based design are resized uniformly so as to shrink the patterns, and no account is taken of the connection of the pattern between cells, an unnecessary gap is generated between character patterns as shown in FIGS. 8 to 10. Then, when a circuit pattern is drawn by the CP method using the character patterns, the gap (which would originally be a connecting portion) between character patterns has to be supplemented by VSB method as described above.

In the present embodiment, as an example of the resizing (shrinking) process of FIGS. 8 to 10, a method for extracting a pattern having the best shape as the character pattern for suppressing poor connections between cells and thus the necessity of VSB shooting based on the character pattern extracting technique using the cell layout frame included in the figure cells will be described.

Figure 11:
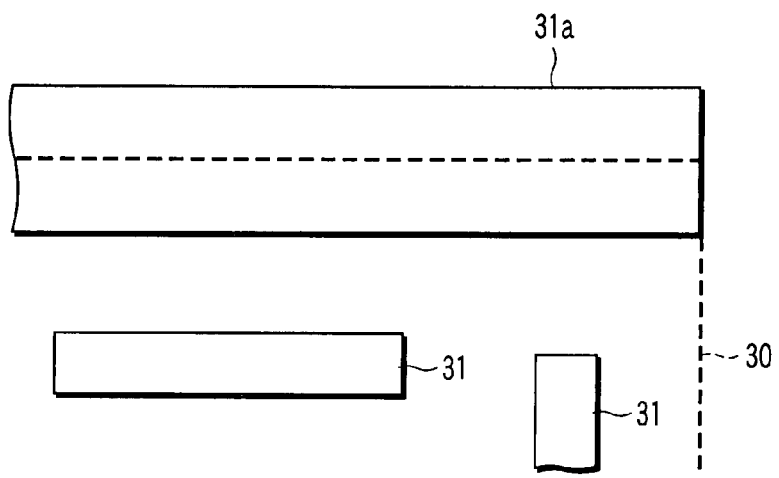
FIG. 11 is an enlarged view of the upper right part of the figure cells in FIG. 5.

FIG. 11 is an enlarged view of the upper right part of the figure cells shown in FIG. 5. In FIG. 11, numeral 30 indicates a cell layout frame, 31 indicates a pattern (figure) fitting in the cell layout frame 30, and 31a indicates a pattern (figure) overlapping with the cell layout frame 30.

The cell layout frame 30 indicates the boundary with other cells. The patterns fitting in the cell layout frame 30 do not interfere with the patterns in surrounding cells.

Figure 12:
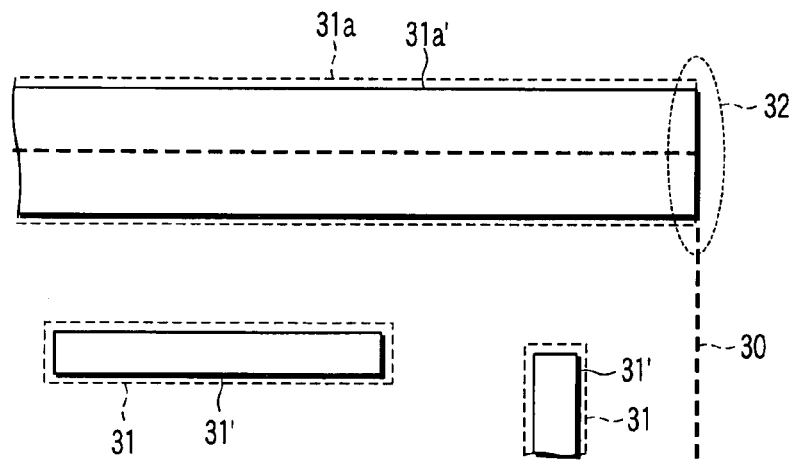
FIG. 12 shows figure cells obtained by resizing (shrinking) the upper right part of the figure cells of FIG. 5 in a first embodiment.

Then, in the present embodiment, all of the sides of the patterns 31 fitting in the cell layout frame 30 are shrunk uniformly by moving the sides inward by a specified resizing quantity using a conventional manner as shown in FIG. 12. In FIG. 12, patterns 31' indicate the resized patterns 31.

In contrast, in a figure in which a certain side of a pattern is in contact with the cell layout frame 30, the part can be judged as a connecting portion with a pattern in an adjacent cell. In the conventional technique, the judgment cannot be made and therefore the pattern must be expanded into the upper layer cells.

However, in the present embodiment, using the cell layout frame as a criterion, it is judged that the sides in contact with the cell layout frame should not be moved inward in the resizing process.

Then, in the present embodiment, as shown in FIG. 12, a pattern (figure) 31a having sides (the sides in an area 32 enclosed by a dotted line) in contact with the cell layout frame 30 is resized (shrunk) by moving only the sides in no contact with the cell layout frame 30 inward by the resizing quantity. In FIG. 12, pattern 31a' indicates the resized pattern 31a.

In the case of the figure cells shown in FIG. 11, a certain side of the pattern 31a arranged so as to overlap with the cell layout frame 30 is in contact with the cell layout frame 30. As for the pattern 31a protruding from the cell layout frame 30, the pattern in the cell layout frame (equivalent to a character pattern cutting frame) is eventually extracted as a character pattern. Therefore, in the case of the cell, the sides on the moving target (the sides in no contact with the cell layout frame) are moved inside the figure by the resizing quantity, regardless of whether the sides are inside or outside the cell layout frame 30.

As described above, in the first embodiment, in a case where the character pattern is extracted using the cell layout frame written in Jpn. Pat. Appln. KOKAI Publication No. 2005-268657, when a resizing process is needed, the resizing process is carried out at the time of, or after performing the figure calculation for removing figure overlaps in a cell, etc. Thereafter, following the resizing process, the character pattern cutting frame is created and adjusted, and then the patterns inside and outside the character pattern culling frame can be separated into character patterns and non-character patterns.

According to the present embodiment, using the cell layout frame 30 included in the figure cells of the candidate character pattern as a reference, it is possible to judge whether the connecting portion with the pattern in the figure cells arranged around the frame is present or not. Therefore, it is not necessary to expand the cells into the upper layer cells. Consequently, an increase the figure calculation amount at the time of character pattern extraction can be suppressed and the figures in the character pattern cutting frame (CP cutting frame) created from the cell layout frame 30 can be extracted as a character pattern.

In addition, by using the CP cutting frame created based on the cell layout frame 30, it is possible to performed sophisticated character pattern extraction with a small calculation amount, in which the generation of non-character patterns (patterns formed by VSB shots) and the generation of sliver VSB shots is suppressed.

Second Embodiment

In the present embodiment, a resizing (shrinking) process when a pattern in a figure cell targeted for character pattern extraction protrudes from the cell layout frame by a smaller quantity than the specified resizing quantity will be described.

Figure 13:
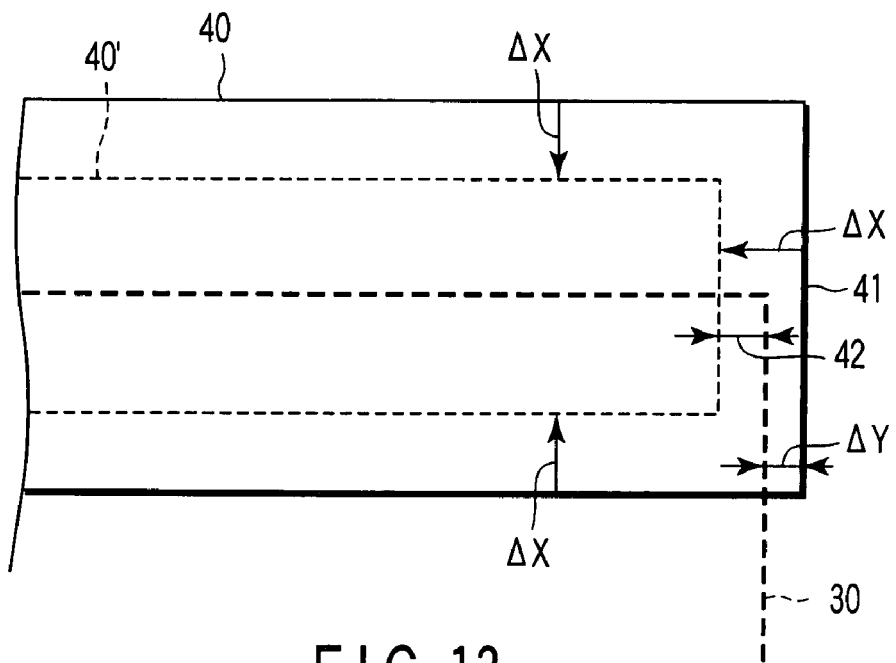
FIG. 13 shows a pattern including the sides protruding from the cell layout frame by a smaller quantity than the resizing quantity.

FIG. 13 is an enlarged view of the upper right part of a figure cell used as an example. A pattern 40 is arranged so as to overlap the cell layout frame 30. A pattern 40' resized by moving all of the sides of the pattern 40 inward according to the resizing quantity $\Delta X$ shown by an arrow is shown by a broken line. In this case, if the resized pattern 40' is adopted, a gap 42 between the cell layout frame 30 and the pattern 40' is generated. That is, character patterns alone cannot connect with a pattern in an adjacent figure cell.

Then, in the present embodiment, as shown in FIG. 13, when patterns in the figure cell include a side 41 protruding from the cell layout frame by a smaller quantity $\Delta Y$ (protruding quantity $\Delta Y$) than the resizing quantity $\Delta X$, a process which differs from the process for patterns all fitting in the cell layout frame 30 or patterns whose sides are in contact with the cell layout frame as shown in the first embodiment is performed.

Figure 14:
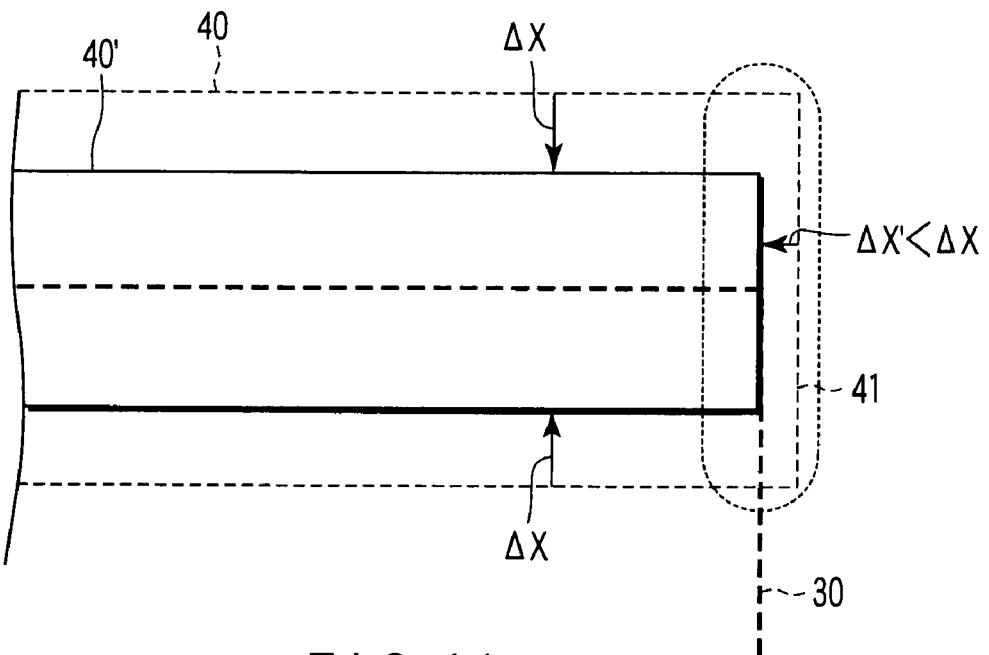
FIG. 14 shows figure cells obtained by resizing (shrinking) the upper right part of the figure cells of FIG. 13 in a second embodiment.

That is, as shown in FIG. 14, when the side 41 of the pattern is moved inside the figure by resizing quantity $\Delta X$, if the side 41 moves inside the cell layout frame 30, the movement amount (resizing quantity=$\Delta X'$ ($<\Delta X$)) is increased until the side 41 makes contact with the cell layout frame 30. In other words, when the pattern protrudes from the cell layout frame 30 by less than the resizing quantity, the protruding part is formed into a shape in contact with the cell layout frame 30, which makes it possible to extract the character pattern by the resizing process, while maintaining contact with the patterns in the adjacent figure cell.

According to the present embodiment, even when a pattern protrudes from the cell layout frame 30, the resizing process can be done using the cell layout frame as a reference, and character patterns can be extracted while maintaining the connection with the patterns in the surrounding figure cells.

Even in the resizing process of the second embodiment, as the figure need not be expanded into the upper layer cells, an increase in the figure calculation amount at the time of extracting the character pattern can be suppressed and the figures in the CP cutting frame created from the cell layout frame 30 can be extracted as a character pattern.

Third Embodiment

A resizing process that takes a more general cell layout frame into consideration can be realized by combining the first and second embodiments.

That is, based on a relation of magnitude between the protruding quantity of a pattern which protrudes from the cell layout frame and the resizing quantity, it is judged whether the side is moved inward by the resizing quantity or the side is moved to a position where the side comes in contact with the cell layout frame with a movement amount that is less than the resizing quantity.

Figure 15:
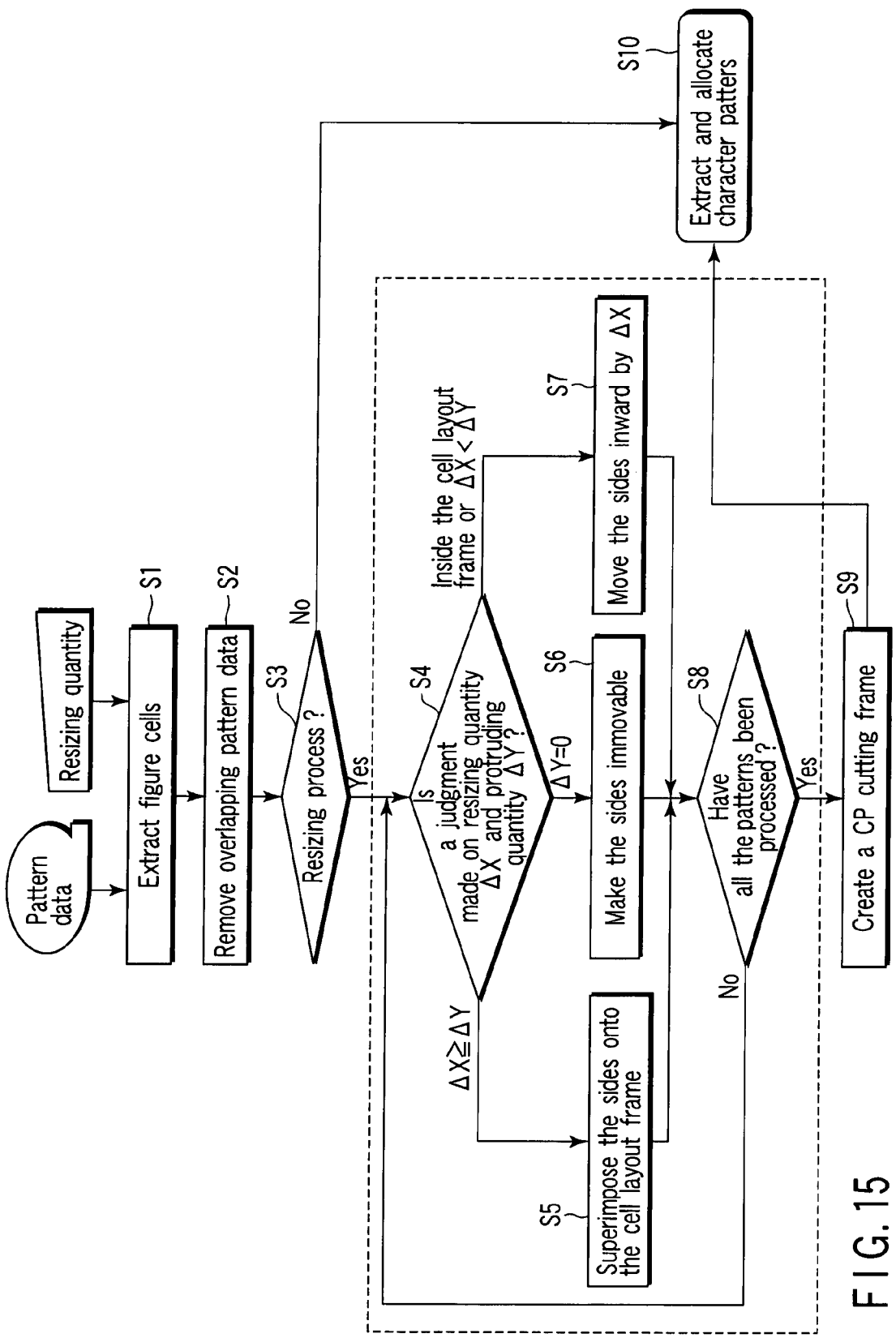
FIG. 15 is a flowchart showing an EB writing data creating method according to a third embodiment.

A flowchart for an electron beam (EB) writing data creating method considering the general cell layout frame including the above mentioned case in addition to a case where the sides of a pattern are in contact with the cell layout frame (the protruding quantity is 0) is shown in FIG. 15. In FIG. 15, an area enclosed by a broken line corresponds to the step of the resizing process.

Step S1

Pattern data, such as layout data of a device pattern to be drawn by EB writing is input to a data conversion system, and then the data conversion system extracts figure cells. At this time, data on the resizing quantity is also input. The data conversion system specifies the direction of movement and amount of movement for a layer in which the cell layout frame is moved. When a figure cell is rotated or reversed, the figure cell is extracted as a different character for each of inversion, non-inversion, and rotation angle.

Step S2

As for the patterns in the layer targeted for the process in the extracted figure cell, an overlap between patterns is removed. If a plurality of cell layout frame patterns are included, their overlaps are removed similarly.

Step S3

It is judged whether the extracted figure cell needs to be subjected to a resizing process.

Step S4

If the result of the judgment in step S3 has shown that there are patterns which need to be subjected to a resizing process, one of the patterns is selected, and then judgment is made on the resizing quantity $\Delta X$ and protruding quantity $\Delta Y$ for each of the sides of the selected pattern. Specifically, it is judged whether $\Delta X \geq \Delta Y$, $\Delta Y=0$, or $\Delta X<\Delta Y$, i.e., whether the selected pattern is within the cell layout frame.

Step S5

If the result of the judgment in step S4 has shown that $\Delta X \geq \Delta Y$, the sides are overlapped with the cell layout frame. This corresponds to the resizing process of the side 41 of the pattern 40 in FIG. 14.

Step S6

If the result of the judgment in step S4 has shown that $\Delta Y=0$, the sides are not moved. This corresponds to the resizing process of the pattern 31a having a side in contact with the cell layout frame 30 of FIG. 12 (the side in the area 32 enclosed with a dotted line).

Step S7

If the result of the judgment in step S4 has shown that $\Delta X<\Delta Y$ or the selected pattern is within the cell layout frame, the sides are moved inward by $\Delta X$. This corresponds to the resizing process of the pattern 31a of FIG. 12 or the resizing process of the upper side and lower side of the pattern 40 in FIG. 14.

Step S8

After step S5 to step S7, it is judged whether the resizing process needs to be carried out for all of the patterns.

Step S9

If the result of the judgment in step S8 has shown that all the patterns needing to be subjected to the resizing process have been resized, figure information of the layer specified as a cell layout frame pattern is read, thereby the data for the cell layout frame is extracted, and then, based on the data for the cell layout frame, a CP cutting frame is created. Here, the extracted data is ordinary figure data. In addition, step S9 may be carried out before step S4.

On the other hand, if the result of the judgment in step S8 has shown that patterns needing to be subjected to the resizing process remain, it returns to step S4.

Step S10

A figure in the CP culling frame (a pattern subjected to the resizing process in step S5, S6, or S7) is extracted as the character pattern, and this extracted character pattern is allocated to a pattern to be shot by the character projection method. In addition, if the result of the judgment in step S3 has shown that a figure cell needs no resizing process, the figure cell is extracted as the character pattern, and then this extracted character pattern is allocated to a pattern to be shot by the character projection method.

Thereafter, generally known steps are carried out one after another. That is, as written in Jpn. Pat. Appln. KOKAI Publication No. 2005-268657, the step of setting figures outside the OP culling frame as the non-character pattern, the step of removing the overlaps of the non-character pattern with adjacent patterns and allocating the parts not overlapping with the adjacent patterns to be shot by the variable shaped beam method, and the like are carried out sequentially.

Figure 16:
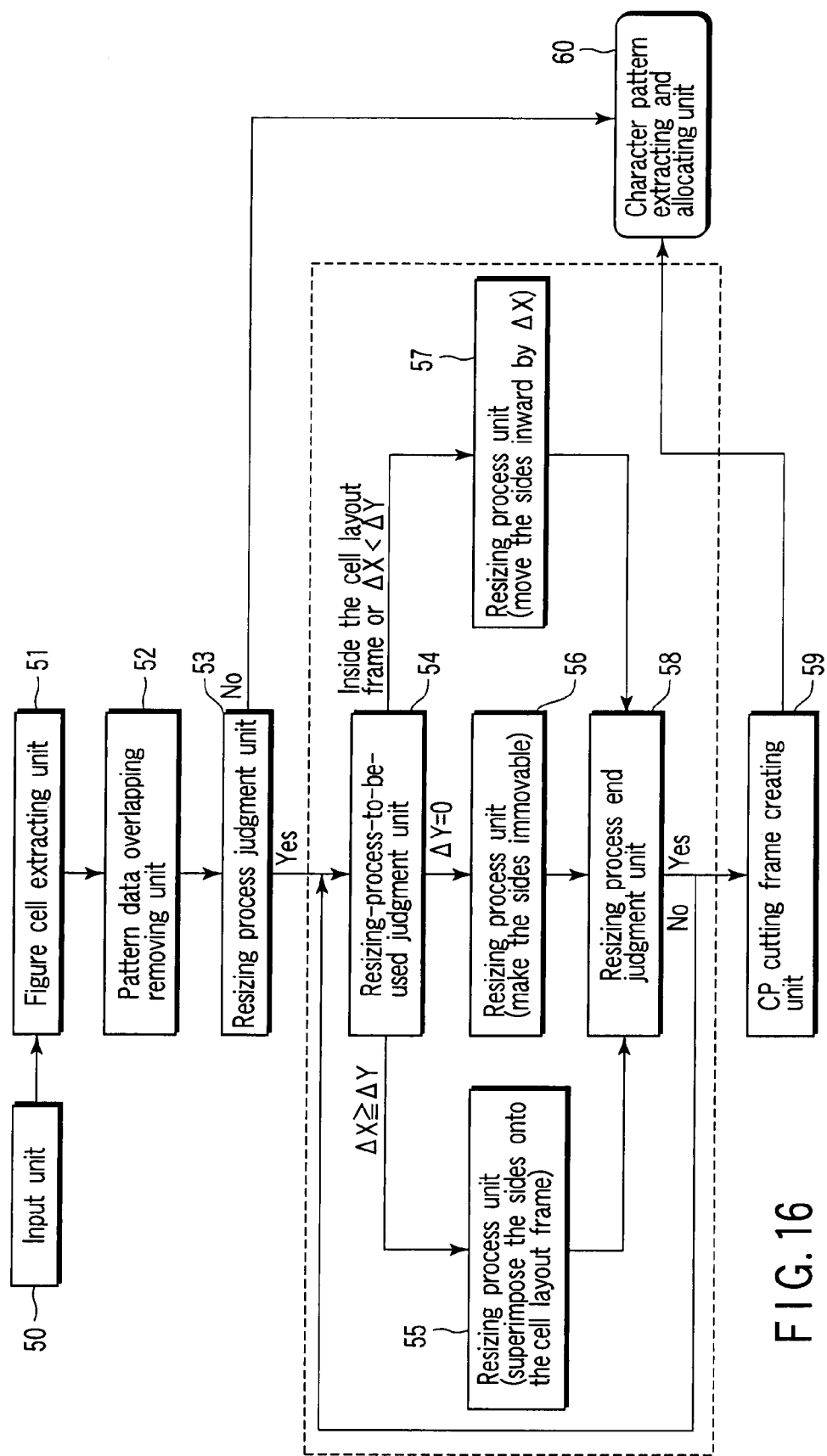
FIG. 16 schematically shows an EB writing data creating apparatus for implementing the EB writing data creating method of the third embodiment.

FIG. 16 schematically shows an EB writing data creating apparatus for implementing the EB writing data creating method of the third embodiment.

The EB writing data creating apparatus comprises an input unit 50, a writing cell extracting unit 51, a pattern data overlapping removing unit 52, a resizing process judgment unit 53, a judgment unit for judging what resizing process is to be carried out (resizing-process-to-be-used judgment unit) 54, resizing process units 55 to 57, a resizing process end judgment unit 58, a CP cutting frame creating unit 59, and a character pattern extracting and allocating unit 60.

The input unit 50 is a unit for inputting to the figure cell extracting unit 51 layout data and resizing quantity data of device patterns to be drawn by EB writing. The units 51 to 60 are units for implementing step S1 to step S10, respectively. In FIG. 16, the area enclosed by a broken line corresponds to the units for implementing the step of the resizing process.

FIG. 16 shows a dedicated writing data creating apparatus; however, the writing data may be created in the EB writing apparatus by providing a writing data creating apparatus for implementing the EB writing data creating method of the embodiment in the EB writing apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for creating writing data used for electron beam lithography of a character projection type, comprising:
   judging whether a resizing process should be performed to a figure cell in device pattern data in a cell-based design, the figure cell including a cell layout frame and a pattern in the cell layout frame;
   performing the resizing process based on a relationship between the cell layout frame and the pattern in the cell layout frame, and a resizing quantity of the resize process, when the judging step determines that the resizing process should be performed;
   creating a character pattern cutting frame from the cell layout frame; and
   extracting a figure within the character pattern cutting frame as a character pattern.

2. The method according to claim 1, further comprising removing overlap of the device pattern data included in the figure cell, and wherein the resizing process is performed at the time of removing the overlap of the device pattern data or after the removing the overlap of the device pattern data.

3. The method according to claim 2, further comprising setting a figure outside the character pattern cutting frame as a non-character pattern; and
   removing overlap between the non-character pattern and a pattern adjacent to the non-character pattern, and allocating a part of the non-character pattern failing to overlap with the pattern adjacent to the non-character pattern to a pattern to be shot by variable shaped beam method.

4. The method according to claim 1, wherein the relationship between the cell layout frame and the pattern in the cell layout frame is a distance between the cell layout frame and the pattern in the cell layout frame.

5. The method according to claim 4, further comprising setting a figure outside the character pattern cutting frame as a non-character pattern; and
   removing overlap between the non-character pattern and a pattern adjacent to the non-character pattern, and allocating a part of the non-character pattern failing to overlap with the pattern adjacent to the non-character pattern to a pattern to be shot by variable shaped beam method.

6. The method according to claim 1, wherein the performing the resizing process comprises:
   in a case where all of patterns of the figure cell are within the character pattern cutting frame and fail to contact the frame, moving the sides of all of the patterns inward by the resizing quantity,
   in a case where any of the patterns of the figure cell contacts the character pattern cutting frame and fits in the frame, leaving a side of any of the patterns contacting the character pattern cutting frame unmoved, in a case where any of the patterns of the figure cell protrudes from the character pattern cutting frame, and a quantity protruding from the character pattern cutting frame is larger than the resizing quantity, moving a side of the any of the patterns protruding from the character pattern cutting frame inward by the resizing quantity, and in a case where any of the patterns of the figure cell protrudes from the character pattern cutting frame, in an amount equal to or less than the resizing quantity, overlapping the side of the any of the patterns protruding from the character pattern cutting frame with the character pattern cutting frame.

7. The method according to claim 6, further comprising setting a figure outside the character pattern cutting frame as a non-character pattern; and removing overlap between the non-character pattern and a pattern adjacent to the non-character pattern, and allocating a part of the non-character pattern failing to overlap with the pattern adjacent to the non-character pattern to a pattern to be shot by variable shaped beam method.

8. The method according to claim 1, further comprising setting a figure outside the character pattern cutting frame as a non-character pattern; and removing overlap between the non-character pattern and a pattern adjacent to the non-character pattern, and allocating a part of the non-character pattern failing to overlap with the pattern adjacent to the non-character pattern to a pattern to be shot by variable shaped beam method.

9. An apparatus for creating writing data used in electron beam lithography, comprising:

a judgment unit configured to judge whether a figure cell in device pattern data in a cell-based design should undergo a resizing process in an electron beam lithography of character projection method, the figure cell including a cell layout frame and a pattern in the cell layout frame;

a resizing process unit configured to perform the resizing process to the figure cell based on a relationship between the cell layout frame and the pattern in the cell layout frame, and a resizing quantity of the resize process, in a case where the judgment unit determines that the resizing process should be performed to the figure cell;

a frame creating unit configured to create a character pattern cutting frame from the cell layout frame; and an extracting unit configured to extract a figure within the character pattern cutting frame as a character pattern.

10. The apparatus according to claim 9, further comprising a removing unit configured to remove overlap between the device pattern data included in the figure cell.

11. The apparatus according to claim 9, wherein the relationship between the cell layout frame and the pattern in the cell layout frame is a distance between the cell layout frame and the pattern in the cell layout frame.

\* \* \* \* \*